US008652961B1

(12) United States Patent
Yang

(10) Patent No.: US 8,652,961 B1
(45) Date of Patent: Feb. 18, 2014

(54) METHODS AND STRUCTURE FOR ADAPTING MEMS STRUCTURES TO FORM ELECTRICAL INTERCONNECTIONS FOR INTEGRATED CIRCUITS

(75) Inventor: Xiao "Charles" Yang, Cupertino, CA (US)

(73) Assignee: mCube Inc., San Jose, CA (US)

(*) Notice: Subject to any disclaimer, the term of this patent is extended or adjusted under 35 U.S.C. 154(b) by 241 days.

(21) Appl. No.: 13/164,311

(22) Filed: Jun. 20, 2011

Related U.S. Application Data

(60) Provisional application No. 61/356,486, filed on Jun. 18, 2010.

(51) Int. Cl.
*H01L 29/84* (2006.01)
(52) U.S. Cl.
USPC .......................... 438/617; 257/415
(58) Field of Classification Search
USPC .......................... 257/415; 438/617
See application file for complete search history.

(56) References Cited

U.S. PATENT DOCUMENTS

| | | | |
|---|---|---|---|
| 3,614,677 A | 10/1971 | Wilfinger | |
| 4,954,698 A | 9/1990 | Yasunaga et al. | |
| 5,140,745 A | 8/1992 | McKenzie | |
| 5,157,841 A | 10/1992 | Dinsmore | |
| 5,173,597 A | 12/1992 | Anglin | |
| 5,493,769 A | 2/1996 | Sakai et al. | |
| 5,610,414 A | 3/1997 | Yoneda et al. | |
| 5,668,033 A | 9/1997 | Ohara | |
| 5,729,074 A | 3/1998 | Shiomi et al. | |
| 6,046,409 A | 4/2000 | Ishii et al. | |
| 6,076,731 A | 6/2000 | Terrell | |
| 6,115,261 A | 9/2000 | Platt et al. | |
| 6,188,322 B1 | 2/2001 | Yao et al. | |
| 6,263,736 B1 | 7/2001 | Thundat et al. | |
| 6,278,178 B1 | 8/2001 | Kwon et al. | |
| 6,480,699 B1 | 11/2002 | Lovoi | |
| 6,483,172 B1 | 11/2002 | Cote | |
| 6,485,273 B1 | 11/2002 | Goodwin-Johansson | |
| 6,534,726 B1 | 3/2003 | Okada et al. | |
| 6,656,604 B2 | 12/2003 | Hasewaga | |

(Continued)

OTHER PUBLICATIONS

International Search Report and Written Opinion of PCT Application No. PCT/US10/054567, mailed on Jan. 6, 2011, 7 pages total.

(Continued)

*Primary Examiner* — Howard Weiss
*Assistant Examiner* — Steven Rao
(74) *Attorney, Agent, or Firm* — Kilpatrick Townsend & Stockton LLP

(57) ABSTRACT

Methods and structure for adapting MEMS structures to form electrical interconnections for integrated circuits. A first portion and a second portion of the metal conductor, which can be electrically isolated within a CMOS IC device, can be etched to form an unetched portion of the metal conductor. The MEMS device can be patterned, from a MEMS layer formed overlying the metal conductor, via a plasma etching process, during which the unetched portion of the metal conductor is protected from the plasma. The metal conductor can be electrically coupled to the CMOS IC device via a conductive jumper or the like. Furthermore, the integrated CMOS-MEMS device can include a MEMS device coupled to a CMOS IC device via an electrically isolated metal conductor within the CMOS IC device. Also, the metal conductor can be electrically coupled to the substrate of the CMOS IC device via a conductive jumper.

10 Claims, 8 Drawing Sheets

(56) References Cited

U.S. PATENT DOCUMENTS

| | | |
|---|---|---|
| 6,753,664 B2 | 6/2004 | Neufeld et al. |
| 6,855,572 B2 | 2/2005 | Jeun et al. |
| 6,912,336 B2 | 6/2005 | Ishii |
| 6,933,165 B2 | 8/2005 | Musolf et al. |
| 6,979,872 B2 * | 12/2005 | Borwick et al. ............ 257/415 |
| 7,019,434 B2 | 3/2006 | Helmbrecht |
| 7,095,226 B2 | 8/2006 | Wan et al. |
| 7,145,555 B2 | 12/2006 | Taylor et al. |
| 7,183,630 B1 | 2/2007 | Fogelson et al. |
| 7,195,945 B1 | 3/2007 | Edelstein et al. |
| 7,239,000 B2 | 7/2007 | Witcraft |
| 7,253,079 B2 | 8/2007 | Hanson et al. |
| 7,258,009 B2 | 8/2007 | Imai |
| 7,358,724 B2 | 4/2008 | Taylor et al. |
| 7,370,530 B2 | 5/2008 | DCamp et al. |
| 7,391,091 B2 | 6/2008 | Tondra |
| 7,402,449 B2 | 7/2008 | Fukuda et al. |
| 7,430,674 B2 | 9/2008 | Van Mueller et al. |
| 7,454,705 B2 | 11/2008 | Cadez et al. |
| 7,456,042 B2 | 11/2008 | Stark |
| 7,493,496 B2 | 2/2009 | Smith et al. |
| 7,498,715 B2 | 3/2009 | Yang |
| 7,511,379 B1 | 3/2009 | Flint |
| 7,514,760 B1 | 4/2009 | Quevy |
| 7,521,783 B2 | 4/2009 | Tsai et al. |
| 7,536,909 B2 | 5/2009 | Zhao et al. |
| 7,599,277 B1 | 10/2009 | Kato et al. |
| 7,612,443 B1 | 11/2009 | Bernstein et al. |
| 7,671,478 B2 | 3/2010 | Wathanawasam et al. |
| 7,676,340 B2 | 3/2010 | Yasui |
| 7,690,255 B2 | 4/2010 | Gogoi et al. |
| 7,708,189 B1 | 5/2010 | Cipriano |
| 7,713,785 B1 | 5/2010 | Flint |
| 7,779,689 B2 | 8/2010 | Li et al. |
| 7,814,791 B2 | 10/2010 | Andersson et al. |
| 7,814,792 B2 | 10/2010 | Tateyama et al. |
| 7,814,793 B2 | 10/2010 | Sato |
| 7,861,422 B2 | 1/2011 | McDonald |
| 7,891,103 B2 | 2/2011 | Mayor |
| 8,011,577 B2 | 9/2011 | Mullen et al. |
| 8,016,191 B2 | 9/2011 | Bonalle et al. |
| 8,037,758 B2 | 10/2011 | Sato |
| 8,056,412 B2 | 11/2011 | Rutkiewicz et al. |
| 8,061,049 B2 | 11/2011 | Mayor |
| 8,070,055 B2 | 12/2011 | Block et al. |
| 8,087,296 B2 | 1/2012 | Ueda et al. |
| 8,140,358 B1 | 3/2012 | Ling et al. |
| 8,148,808 B2 | 4/2012 | Braden et al. |
| 8,165,323 B2 | 4/2012 | Zhou |
| 8,181,874 B1 | 5/2012 | Wan et al. |
| 8,227,285 B1 | 7/2012 | Yang |
| 8,236,577 B1 | 8/2012 | Hsu |
| 8,245,923 B1 | 8/2012 | Merrill et al. |
| 8,250,921 B2 | 8/2012 | Nasiri et al. |
| 8,259,311 B2 | 9/2012 | Petschko |
| 8,324,047 B1 | 12/2012 | Yang |
| 8,342,021 B2 | 1/2013 | Oshio |
| 8,367,522 B1 | 2/2013 | Yang |
| 8,395,252 B1 | 3/2013 | Yang |
| 8,395,381 B2 | 3/2013 | Lo |
| 8,402,666 B1 | 3/2013 | Hsu et al. |
| 8,407,905 B1 | 4/2013 | Hsu et al. |
| 8,421,082 B1 | 4/2013 | Yang |
| 8,476,084 B1 | 7/2013 | Yang et al. |
| 8,476,129 B1 | 7/2013 | Jensen et al. |
| 8,477,473 B1 | 7/2013 | Koury et al. |
| 8,486,723 B1 | 7/2013 | Wan et al. |
| 2001/0053565 A1 | 12/2001 | Khoury |
| 2002/0072163 A1 | 6/2002 | Wong et al. |
| 2002/0134837 A1 | 9/2002 | Kishon |
| 2003/0058069 A1 | 3/2003 | Schwartz et al. |
| 2003/0095115 A1 | 5/2003 | Brian et al. |
| 2003/0133489 A1 | 7/2003 | Hirota et al. |
| 2003/0184189 A1 | 10/2003 | Sinclair |
| 2004/0002808 A1 | 1/2004 | Hashimoto et al. |
| 2004/0016995 A1 | 1/2004 | Kuo et al. |
| 2004/0017644 A1 | 1/2004 | Goodwin-Johansson |
| 2004/0056742 A1 | 3/2004 | Dabbaj |
| 2004/0063325 A1 | 4/2004 | Urano et al. |
| 2004/0104268 A1 | 6/2004 | Bailey |
| 2004/0113246 A1 | 6/2004 | Boon |
| 2004/0119836 A1 | 6/2004 | Kitaguchi et al. |
| 2004/0140962 A1 | 7/2004 | Wang et al. |
| 2004/0177045 A1 | 9/2004 | Brown |
| 2004/0207035 A1 | 10/2004 | Witcraft et al. |
| 2004/0227201 A1 | 11/2004 | Borwick et al. |
| 2005/0074147 A1 | 4/2005 | Smith et al. |
| 2005/0174338 A1 | 8/2005 | Ing |
| 2005/0199791 A1 | 9/2005 | Sengoku et al. |
| 2005/0247787 A1 | 11/2005 | Von Mueller et al. |
| 2005/0252293 A1 | 11/2005 | Won et al. |
| 2006/0049826 A1 | 3/2006 | Daneman et al. |
| 2006/0081954 A1 | 4/2006 | Tondra et al. |
| 2006/0141786 A1 | 6/2006 | Boezen et al. |
| 2006/0168832 A1 | 8/2006 | Yasui et al. |
| 2006/0192465 A1 | 8/2006 | Kornbluh et al. |
| 2006/0208326 A1 | 9/2006 | Nasiri et al. |
| 2006/0211044 A1 | 9/2006 | Green |
| 2006/0238621 A1 | 10/2006 | Okubo et al. |
| 2006/0243049 A1 | 11/2006 | Ohta et al. |
| 2006/0274399 A1 | 12/2006 | Yang |
| 2007/0046239 A1 | 3/2007 | Hashizume |
| 2007/0132733 A1 | 6/2007 | Ram |
| 2007/0152976 A1 | 7/2007 | Townsend et al. |
| 2007/0181962 A1 | 8/2007 | Partridge et al. |
| 2007/0200564 A1 | 8/2007 | Motz et al. |
| 2007/0281379 A1 | 12/2007 | Stark et al. |
| 2008/0014682 A1 | 1/2008 | Yang et al. |
| 2008/0066547 A1 | 3/2008 | Tanaka et al. |
| 2008/0110259 A1 | 5/2008 | Takeno |
| 2008/0119000 A1 | 5/2008 | Yeh et al. |
| 2008/0123242 A1 | 5/2008 | Zhou |
| 2008/0210007 A1 | 9/2008 | Yamaji et al. |
| 2008/0211043 A1 | 9/2008 | Chen |
| 2008/0211113 A1 | 9/2008 | Chua et al. |
| 2008/0211450 A1 | 9/2008 | Yamada et al. |
| 2008/0277747 A1 | 11/2008 | Ahmad |
| 2008/0283991 A1 | 11/2008 | Reinert |
| 2009/0007661 A1 | 1/2009 | Nasiri et al. |
| 2009/0015251 A1 | 1/2009 | Azumi et al. |
| 2009/0049911 A1 | 2/2009 | Fukuda et al. |
| 2009/0108440 A1 | 4/2009 | Meyer et al. |
| 2009/0115412 A1 | 5/2009 | Fuse |
| 2009/0153500 A1 | 6/2009 | Cho et al. |
| 2009/0262074 A1 | 10/2009 | Nasiri et al. |
| 2009/0267906 A1 | 10/2009 | Schroderus |
| 2009/0307557 A1 | 12/2009 | Rao et al. |
| 2009/0321510 A1 | 12/2009 | Day et al. |
| 2010/0044121 A1 | 2/2010 | Simon et al. |
| 2010/0045282 A1 | 2/2010 | Shibasaki et al. |
| 2010/0071467 A1 | 3/2010 | Nasiri et al. |
| 2010/0075481 A1 | 3/2010 | Yang |
| 2010/0083756 A1 | 4/2010 | Merz et al. |
| 2010/0095769 A1 | 4/2010 | Matsumoto et al. |
| 2010/0109102 A1 | 5/2010 | Chen et al. |
| 2010/0171570 A1 | 7/2010 | Chandrahalim |
| 2010/0208118 A1 | 8/2010 | Ueyama |
| 2010/0236327 A1 | 9/2010 | Mao |
| 2010/0248662 A1 | 9/2010 | Sheynblat et al. |
| 2010/0260388 A1 | 10/2010 | Garrett et al. |
| 2010/0302199 A1 | 12/2010 | Taylor et al. |
| 2010/0306117 A1 | 12/2010 | Terayoko |
| 2010/0307016 A1 | 12/2010 | Mayor et al. |
| 2010/0312519 A1 | 12/2010 | Huang et al. |
| 2011/0131825 A1 | 6/2011 | Mayor et al. |
| 2011/0146401 A1 | 6/2011 | Inaguma et al. |
| 2011/0154905 A1 | 6/2011 | Hsu |
| 2011/0172918 A1 | 7/2011 | Tome |
| 2011/0183456 A1 | 7/2011 | Hsieh et al. |
| 2011/0198395 A1 | 8/2011 | Chen |
| 2011/0265574 A1 | 11/2011 | Yang |
| 2011/0266340 A9 | 11/2011 | Block et al. |
| 2011/0312349 A1 | 12/2011 | Forutanpour et al. |

(56) References Cited

U.S. PATENT DOCUMENTS

2012/0007597 A1 1/2012 Seeger et al.
2012/0007598 A1 1/2012 Lo et al.
2012/0215475 A1 8/2012 Rutledge et al.

OTHER PUBLICATIONS

Notice of Allowance for U.S. Appl. No. 12/717,070, mailed on Mar. 9, 2012, 9 pages.
Office Action for U.S. Appl. No. 12/945,087, mailed on Mar. 19, 2012, 6 pages.
U.S Appl. No. 12/913,440, Final Office Action mailed Oct. 10, 2013, 10 pages.
U.S Appl. No. 12/944,712 Final Office Action mailed Aug. 21, 2013, 15 pages.
U.S Appl. No. 12/983,309 Notice of Allowance mailed Aug. 13, 2013, 11 pages.
U.S Appl. No. 13/924,457 Notice of Allowance mailed Sep. 18, 2013, 11 pages.
U.S Appl. No. 13/035,969 Non-Final Office Action mailed Oct. 25, 2013, 11 pages.
U.S Appl. No. 12/787,368 Non-Final Office Action mailed Sep. 19, 2013, 19 pages.
U.S Appl. No. 13/922,983 Notice of Allowance mailed Oct. 7, 2013, 10 pages.
U.S Appl. No. 12/787,200 Notice of Allowance mailed Sep. 26, 2013, 11 pages.
U.S Appl. No. 13/177,053 Non-Final Office Action mailed Sep. 18, 2013, 12 pages.
U.S Appl. No. 13/069,355 Final Office Action mailed Oct. 31, 2013, 15 pages.
U.S Appl. No. 13/163,672 Non-Final Office Action mailed Sep. 5, 2013, 7 pages.
U.S Appl. No. 12/940,025 Notice of Allowance mailed Oct. 17, 2013, 10 pages.

* cited by examiner

METHODS AND STRUCTURE FOR ADAPTING MEMS STRUCTURES TO FORM ELECTRICAL INTERCONNECTIONS FOR INTEGRATED CIRCUITS

CROSS-REFERENCES TO RELATED APPLICATIONS

The present application claims priority to and incorporates by reference, for all purposes, the following patent application: U.S. Pat. App. No. 61/356,486, filed Jun. 18, 2010. The present invention also incorporates by reference, for all purposes, the following co-pending patent applications related to CMOS & MEMS devices and IC fabrication methodology: U.S. patent application Ser. No. 12/490,067, filed Jun. 23, 2009, U.S. patent application Ser. No. 12/945,087, filed Nov. 12, 2010, and U.S. patent application Ser. No. 12/913,440, filed Oct. 27, 2010.

BACKGROUND OF THE INVENTION

Embodiments of the present invention relate generally to integrated devices. More specifically, embodiments of present invention provide a method and structure for adapting MEMS structures to form electrical interconnections for integrated circuits (ICs). Merely by way of example, the MEMS structures can include at least an accelerometer, a pressure sensor, an angular rate sensor, a microphone, an inertial sensor, and others. Additionally, the other applications include at least a sensor application or applications, system applications, and broadband applications, among others. But it will be recognized that the invention has a much broader range of applicability.

Research and development in integrated microelectronics have continued to produce astounding progress in CMOS and MEMS. CMOS technology has become the predominant fabrication technology for integrated circuits (IC). MEMS, however, continues to rely upon conventional process technologies. In layman's terms, microelectronic ICs are the "brains" of an integrated device which provides decision-making capabilities, whereas MEMS are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Blackberry™ phone by Research In Motion Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC and MEMS technology has limitless applications through modular measurement devices such as accelerometers, angular rate sensors, actuators, and other sensors. In conventional vehicles, accelerometers and angular rate sensors are used to deploy airbags and trigger dynamic stability control functions, respectively. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, and health care and medical systems.

As described previously, ICs and MEMS can be used to practically engage in various type of environmental interaction.

Although highly successful, ICs and in particular MEMS still have limitations. Similar to IC development, MEMS development, which focuses on increasing performance, reducing size, and decreasing cost, continues to be challenging. Additionally, applications of MEMS often require increasingly complex microsystems that desire greater computational power. Unfortunately, such applications generally do not exist. These and other limitations of conventional MEMS and ICs may be further described throughout the present specification and more particularly below.

From the above, it is seen that techniques for improving operation of integrated circuit devices and MEMS are highly desired.

BRIEF SUMMARY OF THE INVENTION

According to embodiments of the present invention, techniques related generally to integrated devices and systems are provided. More particularly, embodiments of the present invention provide methods and structure for adapting MEMS structure to form electrical interconnections for integrated circuits (ICs). Merely by way of example, the integrated devices can include at least an accelerometer, a gyroscope, an inertial sensor, and others. Additionally, the other applications include at least a sensor application or applications, system applications, and broadband applications, among others. But it will be recognized that the invention has a much broader range of applicability.

In a specific embodiment, the present invention provides a method for manufacturing an integrated CMOS-MEMS device. A CMOS integrated circuit device having a substrate and a metal conductor can be provided. A first portion and a second portion of the metal conductor, which can be electrically insulated from the substrate, can be removed by performing an etching process. The first portion can be a portion that would be directly subjected to plasma during a plasma etching process of a MEMS layer. This second portion can be a portion that would be indirectly subjected to plasma during the MEMS layer plasma etching process. Following these etching processes, a MEMS layer can be formed overlying the CMOS device and patterned by the plasma etch to form a MEMS device overlying the CMOS device. The remaining unetched portion of the metal conductor can be protected from the plasma during the etching of the MEMS device. Furthermore, the metal conductor can be electrically coupled to the substrate via a conductive jumper, or the like. A device manufactured with this method can be protected from damage or defects during the plasma etching process, such as a charge build-up antenna effect.

In a specific embodiment, the present invention provides an integrated MEMS-CMOS device system. The system can include a CMOS integrated circuit device, a MEMS device, and a conductive jumper. The CMOS integrated circuit device can include a substrate and a metal conductor, which can be electrically isolated from the substrate. The MEMS device can be formed overlying the metal conductor and electrically coupled to the CMOS integrated circuit device via the metal conductor. Also, the conductive jumper can be used to couple the metal conductor to the substrate of the CMOS integrated circuit device.

Furthermore, various methods can be used to add protection during manufacture or operation of the integrated circuit. In a specific embodiment, a conductive material can be formed overlying the CMOS device and below the MEMS layer formed overlying the CMOS device. The conductive material can act as shield to protect the MEMS layer from coupling unwanted noise or interference from the CMOS device. In a specific embodiment, manufacture of the CMOS device can include forming a matched passive shield circuit, such as a resistive element and a capacitive element formed in parallel and coupled to a bias point, or a charge protection circuit, such as a junction or diode element and resistor element combination. The charge protection circuit can provide protection from an unwanted high voltage or current; particularly during the MEMS plasma etch. The matched passive shield circuit can improve upon bad oxide leads within the integrated circuitry. Furthermore, an embodiment can include a method of etching a wall surrounding at least one MEMS device during the plasma etching of the MEMS layer. The wall can be a silicon wall, which can be etched from the MEMS layer. The silicon wall can act as a shield of splash guard during a capping process or packaging process to prevent unwanted material from entering the MEMS or CMOS devices. In an embodiment, a device manufactured with a combination of methods, including any or all of the aforementioned methods, can have additional protection from damage or defects during manufacture or operation.

Many benefits are achieved by way of the present invention over conventional techniques. For example, the present technique provides an easy to use process that relies upon conventional technology. In some embodiments, the method provides higher device yields in dies per wafer with the integrated approach. Additionally, the method provides a process and system that are compatible with conventional process technology without substantial modifications to conventional equipment and processes. Preferably, the invention provides for an improved integrated CMOS and MEMS system and related applications for a variety of uses. In one or more embodiments, the present invention provides for all MEMS and related applications, which may be integrated on one or more integrated circuit device structures. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow

BRIEF DESCRIPTION OF THE DRAWINGS

This diagram is merely an example, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

According to the present invention, techniques related generally to integrated devices and systems are provided. More particularly, the present invention provides a methods and structure for adapting MEMS structures to form electrical interconnections for integrated circuits (ICs). Merely by way of example, the MEMS devices can include at least an accelerometer, a pressure sensor, a gyroscope, a microphone, an inertial sensor, and others. Additionally, the other applications include at least a sensor application or applications, system applications, and broadband applications, among others. But it will be recognized that the invention has a much broader range of applicability.

Figure 1:
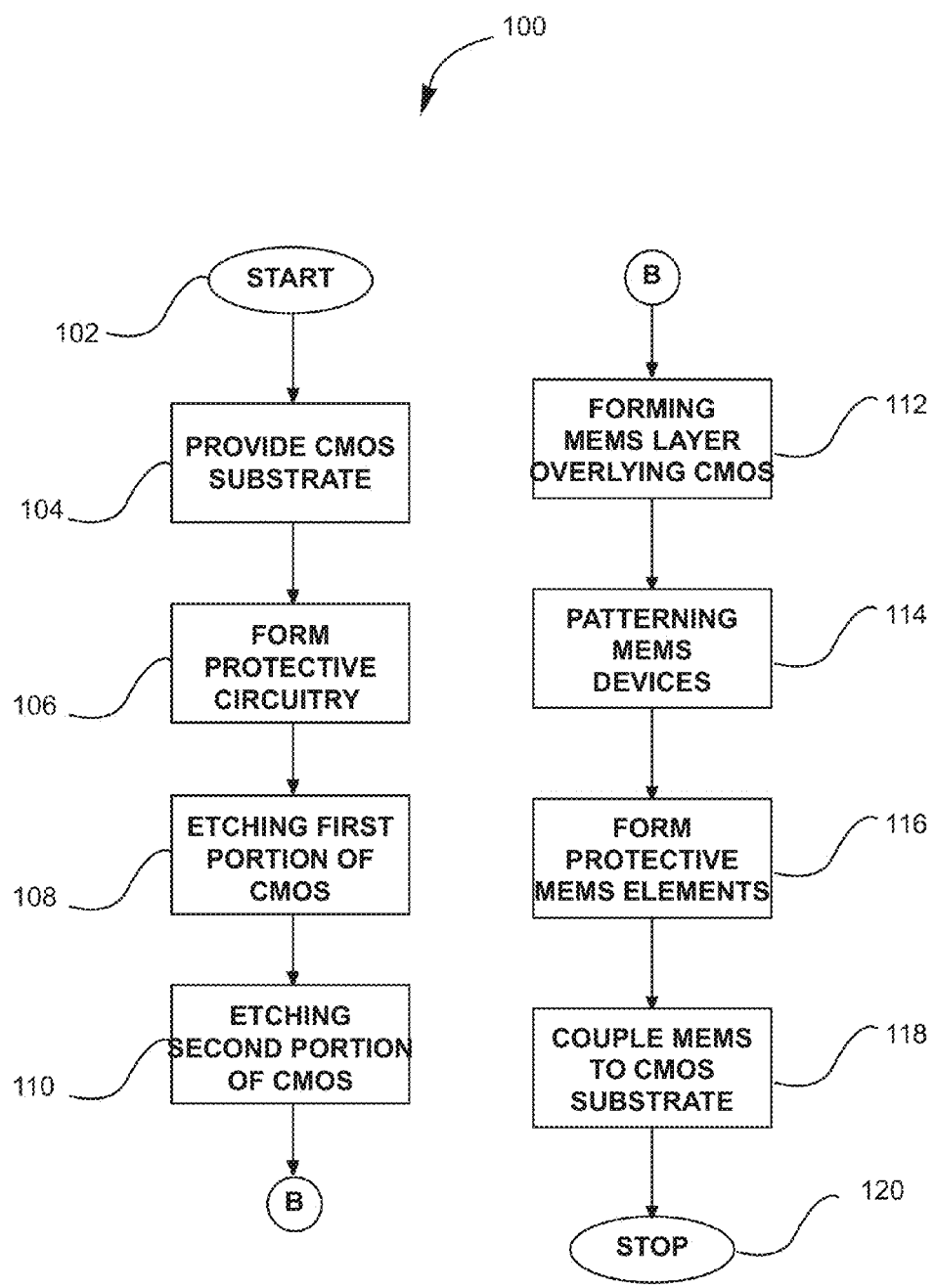
FIG. 1 is a simplified block diagram of a method for forming an integrated CMOS-MEMS device according to an embodiment of the present invention.

FIG. 1 is a simplified flow diagram illustrating methods of fabricating an inertial sensor using tilt conversion according to an embodiment of the present invention.

As shown in FIG. 1, embodiments of a manufacturing process are illustrated. Various steps are also outlined below.
1. Start;
2. Provide a CMOS integrated circuit device having a substrate and a metal conductor;
3. Form protective circuitry coupled to the CMOS integrated circuit device;
4. Etch a first portion of the metal conductor;
5. Etch a second portion of the metal conductor;
6. Form a MEMS layer overlying the CMOS integrated circuit device;
7. Pattern the MEMS layer to form a plurality of MEMS devices;
8. Form MEMS protective elements;
9. Couple the plurality of MEMS to the substrate of the CMOS integrated circuit device; and
10. Stop.

These steps are merely examples and should not unduly limit the scope of the claims herein. As shown, the above methods provide a way of fabricating an inertial sensing device using tilt conversion according to an embodiment of the present invention.

As shown in FIG. 1, an embodiment of method 100 begins at start, step 102. This embodiment is a fabrication method for forming an integrated CMOS-MEMS device. Many benefits are achieved by way of the present invention over conventional techniques. For example, the present technique provides an easy to use process that relies upon conventional technology. In some embodiments, the method provides higher device yields in dies per wafer with the integrated approach. Additionally, the method provides a process and system that are compatible with conventional process technology without substantial modifications to conventional equipment and processes. Preferably, the invention provides for an improved integrated CMOS and MEMS system and related applications for a variety of uses. In one or more embodiments, the present invention provides a protective method of forming interconnections between MEMS devices and CMOS devices that can improve performance and manufacturability. Depending upon the embodiment, one or more of these benefits may be achieved.

Following step 102, embodiment 100 includes providing a CMOS integrated circuit device having a substrate and a metal conductor, step 104. The CMOS integrated circuit device can include one or more circuits including CMOS transistors, resistive elements, capacitative elements, and the like. The circuits can include amplifiers, logic circuits, as well as other circuit types. Furthermore, the metal conductor can be formed overlying the CMOS transistors and can be electrically isolated from the one or more circuits coupled to the substrate.

Additionally, one or more protective circuits can be formed and coupled to the one or more circuits for enhanced performance or reliability, step 106. Such protective circuits can include charge protection circuit and a matched passive shield circuit. The charge protection circuit can include a junction element, such as a diode, and a resistive element coupled to an amplifying circuit, or the like. This configuration of elements can help to prevent high voltage surges from damaging the one or more circuits. On the other hand, the matched passive shield circuit can include a resistive element and a capacitive element, or like elements, formed in parallel and coupled to a bias voltage point. The matched passive shield configuration can help with circuit configurations where there are good oxide charges, but bad oxides leaks. Such a configuration can track the input voltage for various circuits. In a specific embodiment, the resistive element, which can be a feedback resistor, and the capacitive element, which can be a feedback capacitor, can be configured at a specific frequency to improve the voltage tracking of the matched passive shield circuit.

In an embodiment, a first portion of a metal conductor, which can be coupled to the CMOS integrated circuit device, can be removed by performing an etching process, step 108. The first portion can be a portion that would be directly subjected to plasma during a plasma etching process of a MEMS layer. A second portion of the metal conductor can also be removed by performing an etching process, step 110. This second portion can be a portion that would be indirectly subjected to plasma during the MEMS layer plasma etching process. Etching the first and second portion of the metal conductor can leave an unetched portion of the metal conductor within the CMOS integrated circuit device. Following these etching processes, a MEMS layer can be formed overlying the CMOS integrated circuit device, step 112, and patterned by the plasma etch to form a MEMS device overlying the CMOS integrated circuit device, step 114. The unetched portion of the metal conductor can be protected from damage or defects due to the plasma from the plasma etching of the MEMS layer. In an embodiment, the MEMS device can be formed with a vertical distance to the metal conductor that is greater than approximately 2 microns. In various embodiments, the MEMS device can be an accelerometer, a gyroscope, a pressure sensor, a linear motion detector, a tilt sensor, a magnetic sensor, or the like. Also, the width of the metal conductor can range from approximately 0.5 microns to 1 micron. In a specific embodiment, the unetched portion of the metal conductor can have a smaller area than an unetched portion of the MEMS device. Those skilled on the art will recognize other variations, modifications, and alternatives.

Also, protective MEMS elements can be formed both before and during the forming of the MEMS layer and the patterning of the MEMS layer, step 116. In various embodiments, these protective MEMS elements can include a conductive shield and a protective wall structure. The conductive shield can be a conductive material that is formed between the CMOS integrated circuit device and the MEMS layer. The shield can have an opening to allow the metal conductor to be coupled to the plurality of MEMS devices and an opening to allow an additional connection to the metal conductor apart from the MEMS devices. The conductive shield can protect the MEMS devices from coupling noise that decreases performance and reliability. On the other hand, the protective wall can be patterned along with the MEMS devices or formed separately at the same level overlying the CMOS integrated circuit device. The wall can include silicon material and be configured as a splash guard for an encapsulation material that can be formed overlying the plurality of MEMS devices. In a specific embodiment, the silicon wall can surround the plurality of MEMS devices with the encapsulation material formed overlying and surrounding both the MEMS devices and the silicon wall. The silicon wall can prevent unwanted encapsulation materials from coming in contact with the MEMS devices and damaging them.

Following forming and patterning a MEMS layer overlying the CMOS integrated circuit device, the metal conductor can be electrically coupled to the substrate of the CMOS integrated circuit device, step 118. In a specific embodiment, the metal conductor can be electrically coupled to the substrate via a jumper, or like conductive structure. The jumper can couple the metal conductor to another conductive path comprising metal layers within the CMOS integrated circuit device that is coupled to the substrate. A device can be manufactured with this method in conjunction with the previous methods can have additional protection from damage or defects.

The above processes provide a fabrication method for forming an integrated CMOS-MEMS device according to an embodiment of the present invention. As shown, the method uses a combination of steps including providing a CMOS integrated circuit device having a metal conductor, removing portions of the metal conductor that would be directly or indirectly subjected to plasma during a plasma etch, forming a MEMS layer, patterning a plurality of MEMS devices from the MEMS layer with a plasma etching process, and coupling the metal conductor to the substrate of the CMOS integrated circuit device. Other alternatives can also be provided where steps are added, one or more steps are removed, or one or more steps are provided in a different sequence or are performed at the same time, without departing from the scope of the claims herein. Further details of the present method can be found throughout the present specification.

Figure 2:
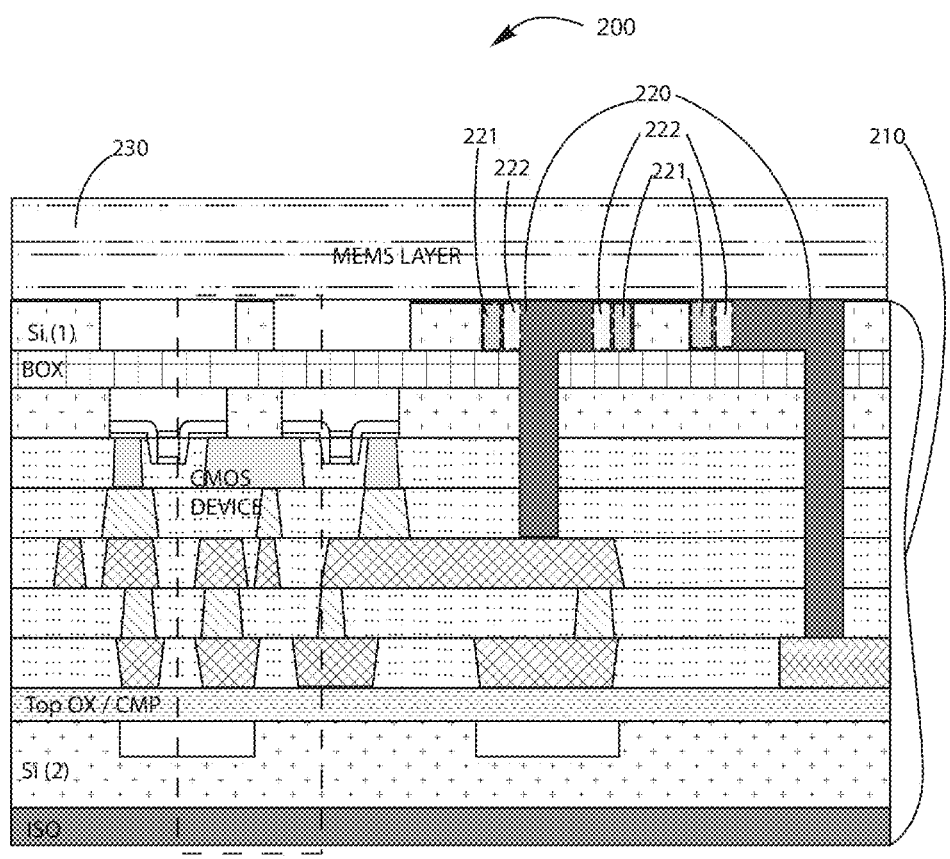
FIG. 2 is a simplified diagram of a cross-sectional view of an integrated circuit according to an embodiment of the present invention.

FIG. 2 is a simplified diagram illustrating an integrated circuit having portions, that would be directly or indirectly subject to plasma, removed according to an embodiment of the present invention. As shown, device 200 includes a CMOS integrated circuit device 210 and MEMS layer 230. In an embodiment, CMOS integrated circuit device 210 can have a metal conductor 220 electrically coupled to a circuit. Metal conductor 220 can have a first portion 221 that would be directly subject to plasma during a plasma etch of a MEMS layer removed prior to the formation of the MEMS layer. Metal conductor 220 can also have a second portion 222 that would be indirectly subject to plasma during the plasma MEMS etch removed prior to the MEMS layer formation. The embodiment shown in FIG. 2 can represent the integrated CMOS-MEMS device prior to the patterning of the MEMS layer to form a MEMS device. More particularly, FIG. 2 shows the first portion(s) and second portion(s) that are removed via etching in preparation of the MEMS patterning such that the metal conductor(s) will not be directly or indirectly subjected to plasma during the plasma etching process.

Figure 3:
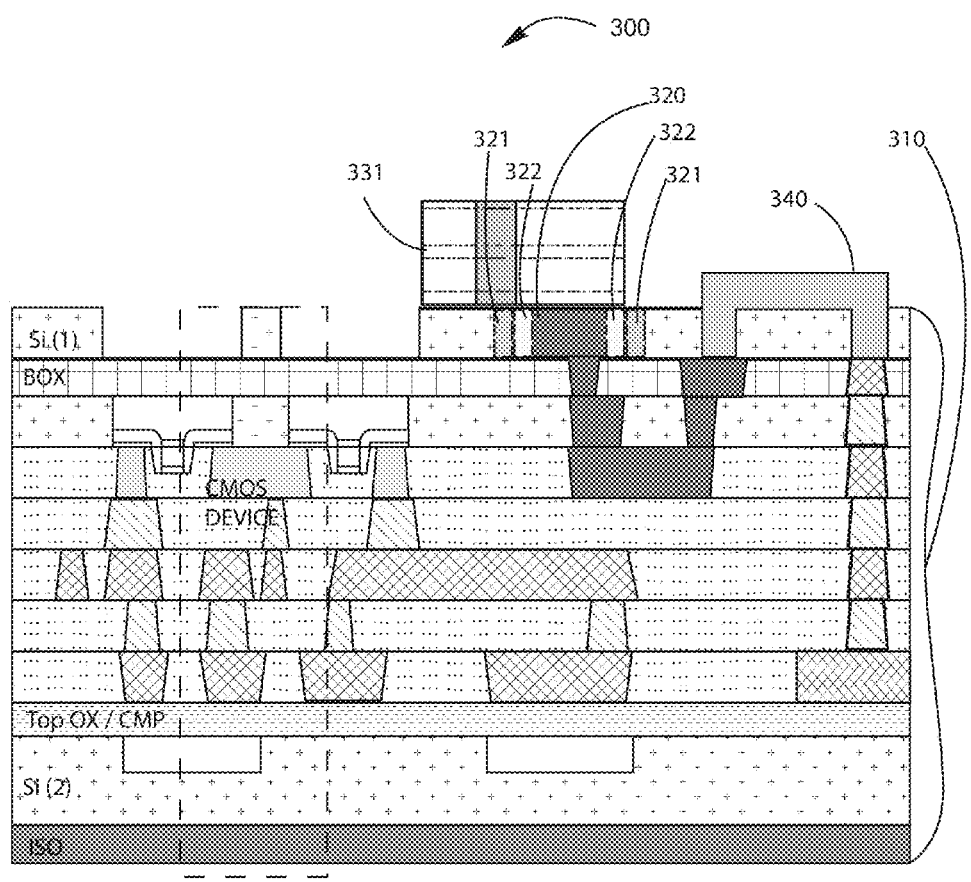
FIG. 3 is a simplified diagram of a cross-sectional view of an integrated circuit according to an embodiment of the present invention.

FIG. 3 is a simplified diagram of an integrated circuit according to an embodiment of the present invention. This diagram is merely an example, which should not unduly limit the scope of the claims herein. One of ordinary skill in the art would recognize many other variations, modifications, and alternatives. As shown, device 300 includes a CMOS integrated circuit device 310 and MEMS device 331. In an embodiment, CMOS integrated circuit device 310 can have a metal conductor 320 that is initially electrically isolated from a circuit of CMOS integrated circuit device 310. Metal conductor 320 can have a first portion 321 that would be directly subject to plasma during a plasma etch of a MEMS layer removed prior to the formation of a MEMS layer. Metal conductor 320 can also have a second portion that would be indirectly subject to plasma during the plasma MEMS etch removed prior to the MEMS layer formation. CMOS integrated circuit device 310 can also have a connector 340, which electrically couples metal conductor 320 to the circuit of CMOS integrated circuit device 310 after MEMS device 331 is formed. In a specific embodiment, connector 340 can be a conductive jumper or other conductive material or the like. The embodiment shown in FIG. 3 can represent the integrated CMOS-MEMS device after the patterning of the MEMS device, which can include inertial sensors, magnetic field sensors, pressure sensors, and the like. More particularly, FIG. 3 shows how the metal conductor 320 has been etched to be protected from the plasma etching of various portions of the MEMS device 331. In the embodiment as shown in FIG. 3, the unetched portion of the metal conductor 320 can have a smaller area than an unetched portion of the MEMS device 331, which overlies it and can shield it from the plasma.

Figure 4:
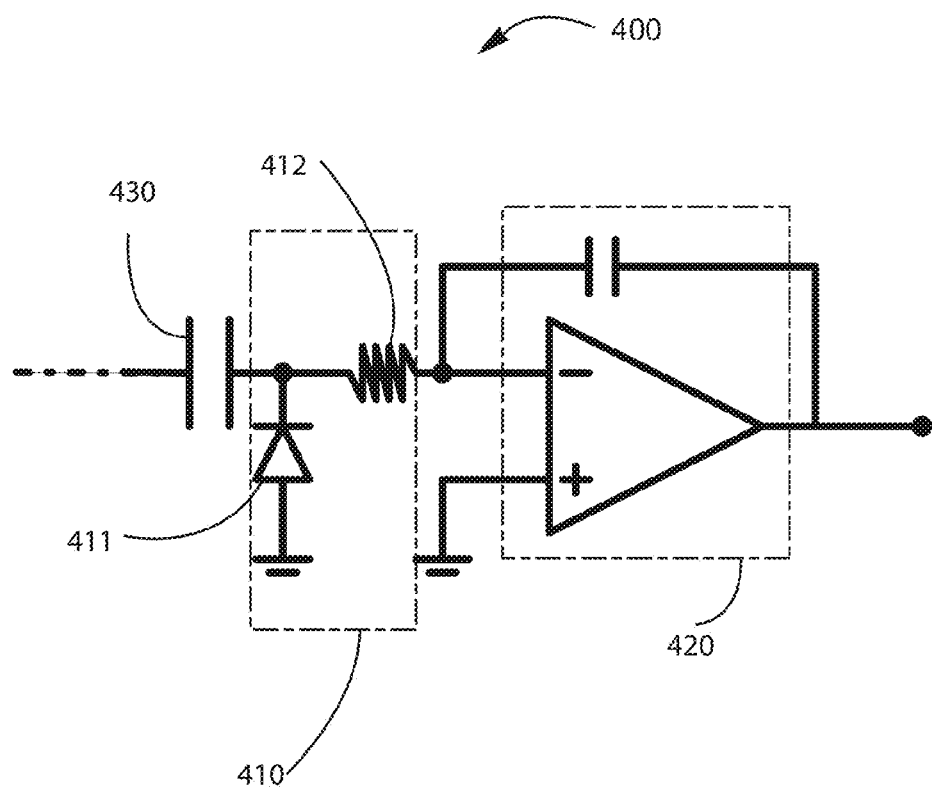
FIG. 4 is a simplified diagram of an integrated circuit according to an embodiment of the present invention.

FIG. 4 is a simplified diagram illustrating an integrated circuit according to an embodiment of the present invention. As shown, device 400 includes a charge protection circuit 410 and an amplifier 420. In an embodiment, charge protection circuit 410 can have a junction element 411 and a resistive element 412. This configuration of elements can help to prevent high voltage surges from damaging the one or more circuits. Particularly, this charge protection circuit can be used at the critical point between amplifier 420 and impedance source 430, such as a MEMS device, sensor, or the like. FIG. 4 can illustrate one of the protective circuits described in the method above for FIG. 1.

Figure 5:
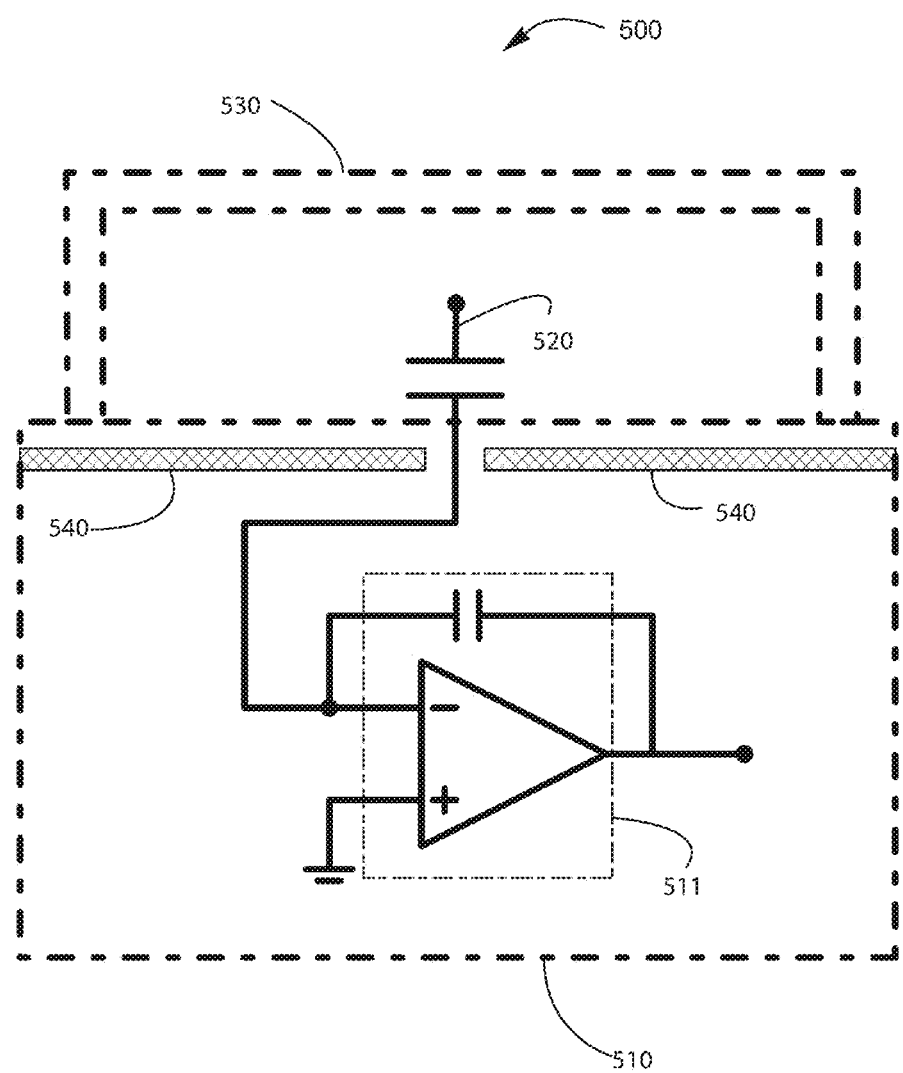
FIG. 5 is a simplified diagram of a cross-sectional view of an integrated CMOS-MEMS device according to an embodiment of the present invention.

FIG. 5 is a simplified diagram illustrating a cross-sectional view of an integrated CMOS-MEMS device according to an embodiment of the present invention. As shown, device 500 includes a CMOS integrated circuit device 510, MEMS element 520, and conductive shielding 540. In an embodiment, conductive shielding 540 can protect MEMS 520 from coupling noise, which can decrease performance and reliability, from circuits such as amplifier 511 and the like. Conductive shielding 540 can be formed between and electrically insulated from MEMS 520 and circuits within CMOS integrated circuit device 510. An encapsulation material 530 can be formed overlying MEMS 520 and the conductive shielding 540. FIG. 5 can illustrate one of the MEMS protective elements described in the method above in FIG. 1.

Figure 6:
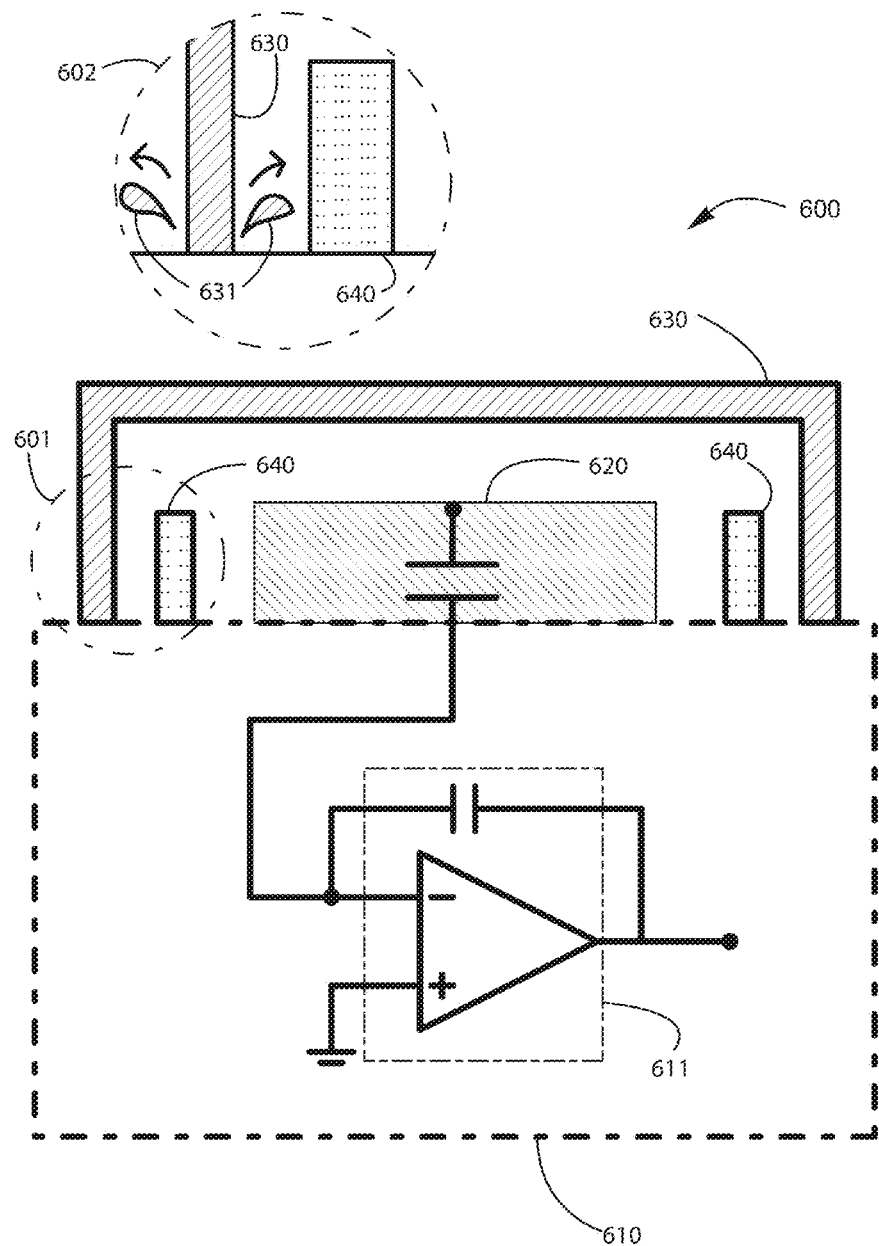
FIG. 6 is a simplified diagram of a cross-sectional view of an integrated CMOS-MEMS device according to an embodiment of the present invention.

FIG. 6 is a simplified diagram illustrating a cross-sectional view of an integrated CMOS-MEMS device according to an embodiment of the present invention. As shown, device 600 includes a CMOS integrated circuit device 610, MEMS element 620, encapsulation 630, and wall structure 640. In an embodiment, wall structure 640, which can include silicon material, can protect MEMS 620 from excess debris that forms from forming encapsulation 630. Contact with such debris can cause damage to the MEMS 620. A more detailed illustration of region 601 is shown in close-up 602. Here, the silicon wall structure 640 prevents the spread of debris 631 that occurs during the formation of encapsulation 630. FIG. 6 can illustrate one of the MEMS protective elements described in the method above in FIG. 1. Also, as described previously, MEMS 620 can be coupled to one or more integrated circuits 611 within CMOS integrated circuit device 610.

Figure 7:
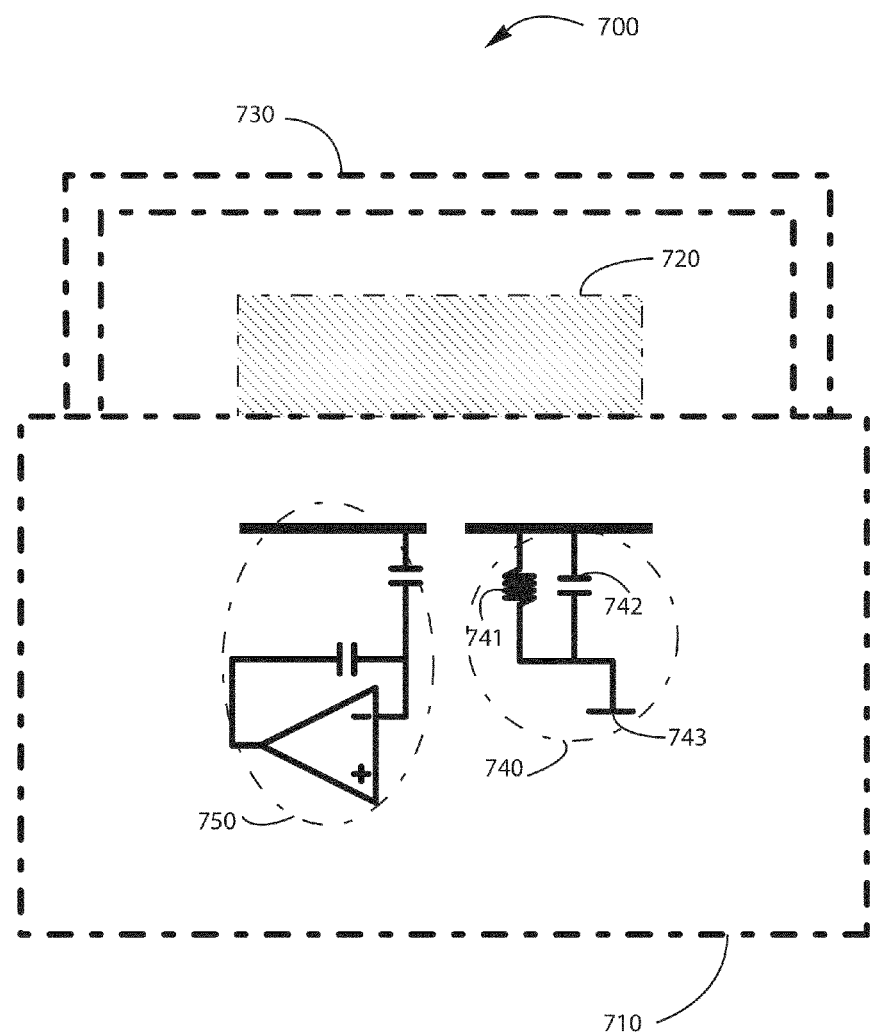
FIG. 7 is a simplified diagram of a cross-sectional view of an integrated CMOS-MEMS device according to an embodiment of the present invention.

FIG. 7 is a simplified diagram illustrating a cross-sectional view of an integrated CMOS-MEMS device according to an embodiment of the present invention. As shown, device 700 includes a CMOS integrated circuit device 710, MEMS element 720, encapsulation 730, matched passive shield circuit 740, and integrated circuit 750. In an embodiment, matched passive shield circuit 740 can be coupled to a bias point 743, which can be an input bias point for an amplifier circuit. The matched passive shield configuration can help with circuit configurations where there are good oxide charges, but bad oxides leaks. Such a configuration can track the input voltage for various circuits such as integrated circuit 750. In a specific embodiment, resistive element 741, which can be a feedback resistor, and capacitive element 742, which can be a feedback capacitor, can be configured at a specific frequency to improve the voltage tracking of the matched passive shield circuit. FIG. 7 can illustrate one of the protection circuits described in the method above in FIG. 1. Those of ordinary skill in the art will recognize other modifications, variations, and alternatives of the embodiments disclosed previously in FIGS. 2-7.

Figure 8:
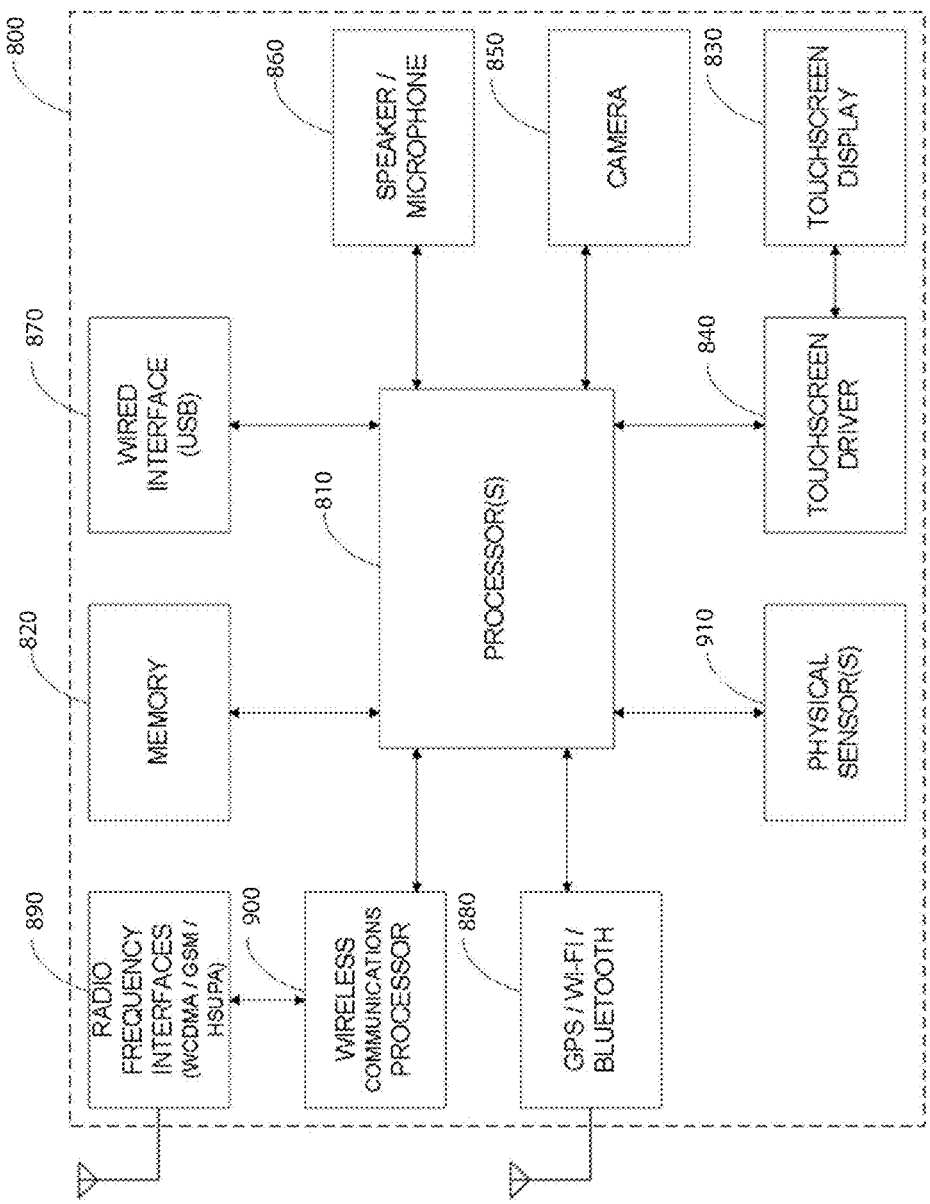
FIG. 8 is a simplified functional block diagram of various embodiments of the present invention.

FIG. 8 illustrates a functional block diagram of various embodiments of the present invention. These embodiments can be various software applications, which provide system-level support of the embodiments previously disclosed. In FIG. 8, a computing device 800 typically includes an applications processor 810, memory 820, a touch screen display 830 and driver 840, an image acquisition device 850, audio input/output devices 860, and the like. Additional communications from and to computing device are typically provided by via a wired interface 870, a GPS/Wi-Fi/Bluetooth interface 880, RF interfaces 890 and driver 900, and the like. Also included in various embodiments are physical sensors 910.

In various embodiments, computing device 800 may be a hand-held computing device (e.g. Apple iPad, Apple iTouch, Dell Mini slate, Lenovo Skylight/IdeaPad, Asus EEE series, Microsoft Courier, Notion Ink Adam), a portable telephone (e.g. Apple iPhone, Motorola Droid, Google Nexus One, HTC Incredible/EVO 4G, Palm Pre series, Nokia N900), a portable computer (e.g. netbook, laptop), a media player (e.g. Microsoft Zune, Apple iPod), a reading device (e.g. Amazon Kindle, Barnes and Noble Nook), or the like.

Typically, computing device 800 may include one or more processors 810. Such processors 810 may also be termed application processors, and may include a processor core, a video/graphics core, and other cores. Processors 810 may be a processor from Apple (A4), Intel (Atom), NVidia (Tegra 2), Marvell (Armada), Qualcomm (Snapdragon), Samsung, TI (OMAP), or the like. In various embodiments, the processor core may be an Intel processor, an ARM Holdings processor such as the Cortex-A, -M, -R or ARM series processors, or the like. Further, in various embodiments, the video/graphics core may be an Imagination Technologies processor PowerVR-SGX, -MBX, -VGX graphics, an Nvidia graphics processor (e.g. GeForce), or the like. Other processing capability may include audio processors, interface controllers, and the like. It is contemplated that other existing and/or later-developed processors may be used in various embodiments of the present invention.

In various embodiments, memory 820 may include different types of memory (including memory controllers), such as flash memory (e.g. NOR, NAND), pseudo SRAM, DDR SDRAM, or the like. Memory 820 may be fixed within computing device 800 or removable (e.g. SD, SDHC, MMC, MINI SD, MICRO SD, CF, SIM). The above are examples of computer readable tangible media that may be used to store embodiments of the present invention, such as computer-executable software code (e.g. firmware, application programs), application data, operating system data or the like. It is contemplated that other existing and/or later-developed memory and memory technology may be used in various embodiments of the present invention.

In various embodiments, touch screen display 830 and driver 840 may be based upon a variety of later-developed or current touch screen technology including resistive displays, capacitive displays, optical sensor displays, electromagnetic resonance, or the like. Additionally, touch screen display 830 may include single touch or multiple-touch sensing capability. Any later-developed or conventional output display technology may be used for the output display, such as TFT-LCD, OLED, Plasma, trans-reflective (Pixel Qi), electronic ink (e.g. electrophoretic, electrowetting, interferometric modulating). In various embodiments, the resolution of such displays and the resolution of such touch sensors may be set based upon engineering or non-engineering factors (e.g. sales, marketing). In some embodiments of the present invention, a display output port, such as an HDMI-based port or DVI-based port may also be included.

In some embodiments of the present invention, image capture device 850 may include a sensor, driver, lens and the like. The sensor may be based upon any later-developed or convention sensor technology, such as CMOS, CCD, or the like. In various embodiments of the present invention, image recognition software programs are provided to process the image data. For example, such software may provide functionality such as: facial recognition, head tracking, camera parameter control, or the like.

In various embodiments, audio input/output 860 may include conventional microphone(s)/speakers. In some embodiments of the present invention, three-wire or four-wire audio connector ports are included to enable the user to use an external audio device such as external speakers, headphones or combination headphone/microphones. In various embodiments, voice processing and/or recognition software may be provided to applications processor 810 to enable the user to operate computing device 800 by stating voice commands. Additionally, a speech engine may be provided in various embodiments to enable computing device 800 to provide audio status messages, audio response messages, or the like.

In various embodiments, wired interface 870 may be used to provide data transfers between computing device 800 and an external source, such as a computer, a remote server, a storage network, another computing device 800, or the like. Such data may include application data, operating system data, firmware, or the like. Embodiments may include any later-developed or conventional physical interface/protocol, such as: USB 2.0, 3.0, micro USB, mini USB, Firewire, Apple iPod connector, Ethernet, POTS, or the like. Additionally, software that enables communications over such networks is typically provided.

In various embodiments, a wireless interface 880 may also be provided to provide wireless data transfers between computing device 800 and external sources, such as computers, storage networks, headphones, microphones, cameras, or the like. As illustrated in FIG. 8, wireless protocols may include Wi-Fi (e.g. IEEE 802.11a/b/g/n, WiMax), Bluetooth, IR and the like.

GPS receiving capability may also be included in various embodiments of the present invention, however is not required. As illustrated in FIG. 8, GPS functionality is included as part of wireless interface 880 merely for sake of convenience, although in implementation, such functionality is currently performed by circuitry that is distinct from the Wi-Fi circuitry and distinct from the Bluetooth circuitry.

Additional wireless communications may be provided via RF interfaces 890 and drivers 900 in various embodiments. In various embodiments, RF interfaces 890 may support any future-developed or conventional radio frequency communications protocol, such as CDMA-based protocols (e.g. WCDMA), GSM-based protocols, HSUPA-based protocols, or the like. In the embodiments illustrated, driver 900 is illustrated as being distinct from applications processor 810. However, in some embodiments, these functionality are provided upon a single IC package, for example the Marvel PXA330 processor, and the like. It is contemplated that some embodiments of computing device 800 need not include the RF functionality provided by RF interface 890 and driver 900.

FIG. 8 also illustrates computing device 800 to include physical sensors 910. In various embodiments of the present invention, physical sensors 910 are multi-axis Micro-Electro-Mechanical Systems (MEMS) based devices being developed by M-cube, the assignee of the present patent application. Physical sensors 910 developed by M-cube currently includes very low power three-axis sensors (linear, gyro or magnetic); ultra-low jitter three-axis sensors (linear, gyro or magnetic); low cost six-axis motion sensor (combination of linear, gyro, and/or magnetic); ten-axis sensors (linear, gyro, magnetic, pressure); and various combinations thereof. As described in the patent applications referenced above, various embodiments of physical sensors 910 are manufactured using a foundry-compatible process. As explained in such applications, because the process for manufacturing such physical sensors can be performed on a standard CMOS fabrication facility, it is expected that there will be a broader adoption of such components into computing device 800. In other embodiments of the present invention, conventional physical sensors 910 may include devices from Bosch, STMicroelectronics, Analog Devices, Kionix or the like.

In various embodiments, any number of future developed or current operating systems may be supported, such as iPhone OS (e.g. 4.0), WindowsMobile (e.g. 7), Google Android (e.g. 2.1), Symbian, or the like. In various embodiments of the present invention, the operating system may be a multi-threaded multi-tasking operating system. Accordingly, inputs and/or outputs from and to touch screen display 830 and driver 840 and inputs/or outputs to physical sensors 910 may be processed in parallel processing threads. In other embodiments, such events or outputs may be processed serially, or the like. Inputs and outputs from other functional blocks may also be processed in parallel or serially, in other embodiments of the present invention, such as image acquisition device 850 and physical sensors 910.

FIG. 8 is representative of one computing device 800 capable of embodying the present invention. It will be readily apparent to one of ordinary skill in the art that many other hardware and software configurations are suitable for use with the present invention. Embodiments of the present invention may include at least some but need not include all of the functional blocks illustrated in FIG. 8. For example, in various embodiments, computing device 800 may lack image acquisition unit 850, or RF interface 890 and/or driver 900, or GPS capability, or the like. Additional functions may also be added to various embodiments of computing device 800, such as a physical keyboard, an additional image acquisition device, a trackball or trackpad, a joystick, or the like. Further, it should be understood that multiple functional blocks may be embodied into a single physical package or device, and various functional blocks may be divided and be performed among separate physical packages or devices.

Embodiments of the present invention provide for improved inertial sensor systems and related applications for a variety of uses. In one or more embodiments, the present invention provides for all MEMS and related applications, which may be integrated on one or more integrated circuit device structures. Depending upon the embodiment, one or more of these benefits may be achieved.

These diagrams are merely examples, which should not unduly limit the scope of the claims herein. In light of the present invention disclosure, one of ordinary skill in the art would recognize many other variations, modifications, and alternatives. For example, various steps outlined above may be added, removed, modified, rearranged, repeated, and/or overlapped, as contemplated within the scope of the invention. It is also understood that the examples and embodiments described herein are for illustrative purposes only and that various modifications or changes in light thereof will be suggested to persons skilled in the art and are to be included within the spirit and purview of this process and scope of the appended claims.

What is claimed is:

1. A method for manufacturing a CMOS-MEMS integrated device, the method comprising:
providing a CMOS integrated circuit device having a substrate and a metal conductor, the metal conductor being electrically isolated from the substrate;
etching a first portion and a second portion of the metal conductor within the CMOS integrated circuit device to form an unetched portion of the metal conductor;
forming a MEMS layer overlying the CMOS integrated circuit device, the MEMS layer being coupled to the metal conductor;
patterning the MEMS layer with a plasma etching process to form a MEMS device overlying the CMOS integrated circuit device, the MEMS device being formed overlying the unetched portion of the metal conductor, wherein the unetched portion of the metal conductor is protected from the plasma during the plasma etching process, wherein the first portion of the metal conductor is etched to remove a portion that would be directly exposed to plasma during the plasma etching process, wherein the second portion of the metal conductor is etched to remove a portion that would be indirectly exposed to plasma during the plasma etching process; and
electrically coupling the metal conductor to the substrate of the CMOS integrated circuit device.

2. The method of claim 1 wherein the MEMS device is formed with a vertical distance to the metal conductor that is greater than approximately 2 microns.

3. The method of claim 1 wherein the width of the metal conductor ranges from approximately 0.5 microns to 1 micron.

4. The method of claim 1 wherein the unetched portion of the metal conductor has a smaller area than an unetched portion of the MEMS device disposed thereabove.

5. The method of claim 1 wherein electrically coupling the metal conductor to the substrate of the CMOS integrated circuit device comprises forming a conductive jumper coupling the conductor to the substrate.

6. The method of claim 1 wherein the MEMS device is selected from a group consisting of: an accelerometer, a gyroscope, a pressure sensor, a motion detector, a magnetic sensor.

7. The method of claim 1 further comprising forming a conductive shielding material overlying the CMOS integrated circuit device, the conductive shielding material being spatially disposed between the CMOS integrated circuit device and the MEMS layer and electrically insulated from the CMOS integrated circuit device and the MEMS device, the conductive shielding material being configured to protect the MEMS layer from coupling noise.

8. The method of claim 1 further comprising forming a charge protection circuit, the charge protection circuit being operably coupled to the CMOS integrated circuit device, the forming of the charge protection circuit including forming a junction element and a resistive element, the junction element and resistive element being operably coupled to at least an amplifier within the CMOS device and the MEMS device.

9. The method of claim 1 further comprising patterning a wall structure surrounding the MEMS device; and further comprising forming an encapsulation overlying the MEMS device and the wall structure, the wall structure being configured to provide debris protection for the MEMS device during the forming of the encapsulation.

10. The method of claim 1 further comprising forming a matched passive shield circuit, the matched passive shield circuit being operably coupled to the CMOS integrated circuit device, the forming of the matched passive shield circuit including forming a capacitive element and a resistive element coupled in parallel to a DC bias point.

* * * * *